United States Patent
Dong

(10) Patent No.: US 7,445,956 B2
(45) Date of Patent: Nov. 4, 2008

(54) FLEXIBLE MEMS THIN FILM WITHOUT MANUFACTURED SUBSTRATE AND PROCESS FOR PRODUCING THE SAME

(76) Inventor: Wen-Chang Dong, No. 15-4, Manping 2nd St., Banciao, Taipei County 200 (TW)

( * ) Notice: Subject to any disclaimer, the term of this patent is extended or adjusted under 35 U.S.C. 154(b) by 402 days.

(21) Appl. No.: 11/287,427

(22) Filed: Nov. 28, 2005

(65) Prior Publication Data
US 2006/0115959 A1  Jun. 1, 2006

(51) Int. Cl.
*H01L 21/44* (2006.01)
*H01L 21/48* (2006.01)
*H01L 21/50* (2006.01)

(52) U.S. Cl. ............... 438/106; 438/110; 257/E21.499

(58) Field of Classification Search ........... 438/106, 438/110, 113, 458–460, 464; 257/E21.499
See application file for complete search history.

(56) References Cited

U.S. PATENT DOCUMENTS 6,982,184 B2 * 1/2006 Silverbrook ............... 438/51

* cited by examiner

*Primary Examiner*—Hoai v Pham
(74) *Attorney, Agent, or Firm*—Bacon & Thomas PLLC

(57) ABSTRACT

A process for producing flexible MEMS thin film without a manufactured substrate applied in a MEMS manufacture specially includes a method of forming a component interface in the middle between a manufactured substrate and a MEMS thin film formed on the manufactured substrate as a basis, which component interface is so easily destroyed by an external force that the MEMS thin film produced by the mentioned process is easily separated from the manufactured substrate, and the separated MEMS thin film due to out of limitation from the manufactured substrate may be further processed in later working process to obtain a MEMS thin film with special structural features has flexibility and particularly has electrical circuits, micro structure, or MEMS components integrated and manufactured into inside or on its both sides.

5 Claims, 7 Drawing Sheets

4a

4b

4c

4d

FLEXIBLE MEMS THIN FILM WITHOUT MANUFACTURED SUBSTRATE AND PROCESS FOR PRODUCING THE SAME

BACKGROUND OF THE INVENTION

1. Field of the Invention

The present invention generally relates to a process for producing flexible microelectromechanical systems (MEMS) thin film without manufactured substrate, more particularly; the flexible MEMS thin film has electrical circuits, micro structure, or MEMS components integrated and manufactured into inside or on both sides.

2. Description of the Prior Art

Conventionally, semiconductor wafer manufacture is meant the semiconductor technique manufactured on a silicon chip. It includes lithography, etching, plating, thin film, chemical mechanical polishing, and ion implantation. For example, the lithography technique is used for image transformation, plating technique is used for plating the metal, ion dry etching is used for anisotropic etching, chemical wet etching is used for isotropic etching, and thin film is used for metal or non-metal thin film growth and coating.

In sum, the semiconductor manufacture uses different kinds of micro image transformation techniques accompanied with different etching, thin film growth and coating, physical and chemical plating to process the metal or non-metal material on the substrate. After the semiconductor manufacture is done, the semiconductor or component is cut along with the substrate for processing other assemblies.

Moreover, different kinds of MEMS techniques developed by the semiconductor manufacture recently can use micro-process techniques to manufacture different kinds of micro mechanisms and MEMS components of micro structure, sensor component, and opto-electronic components on the manufactured substrate. However, only a few micro structures can be removed individually. In other words, most MEMS components for package, testing, or other manufactures require cutting along the manufactured substrate.

However, the structure of the semiconductor or MEMS component with the manufactured substrate has many structural disadvantages including:

1. As shown in FIG. 1, a manufactured substrate (10) occupies the volume of a component (60) over 80%, and the manufactured component (60) is required to process polishing on the manufactured substrate (10).
2. The component (60) can only connect or assembly with circuits on one single side, but we cannot design the circuits on both sides at the same time. Therefore, the structure will affect the design and function of the component (60).

For example, the pressured sensor component used by the MEMS capacitor in package or assembly process requires a single side of the pressure sensor component contacting the environment. Otherwise, it will affect the sensibility of the pressure sensor component.

Or, as shown in FIG. 2 is an example showing the CMOS sensor component (70) of the opto-electronic component. It illustrates that the sensor unit needs to be avoided being covered in the package manufacture. Further, FIG. 3 is another example showing that the CMOS sensor component (70) of the opto-electronic component requires using the transparent package substrate (75).

SUMMARY OF THE INVENTION

The primary object of the present invention is to provide a process for producing flexible MEMS thin film without a manufactured substrate, which in MEMS manufacture specially includes a method of forming a component interface in the middle between a manufactured substrate and a MEMS thin film formed on the manufactured substrate as a basis, after the MEMS manufacture have completely done to produce a MEMS thin film, the component interface is so easily destroyed by an external force to have the MEMS thin film removed from the manufactured substrate, and a flexible MEMS thin film without manufactured substrate is then obtained.

Another object of the present invention is to provide a flexible MEMS thin film without a manufactured substrate by using a method of forming a component interface in MEMS manufacture, the MEMS thin film due to out of limitation from the manufactured substrate has flexibility and particularly has electrical circuits, micro structure, or MEMS components integrated and manufactured into inside or on both sides so that the MEMS thin film is therefore widely applied in practice.

DETAILED DESCRIPTION OF THE INVENTION

The present invention relates to a method of forming component interface in semiconductor or microelectromechanical system (MEMS) manufacture. There are two methods for forming the component interface. One is to control the adhesion ability in the middle between layers for forming a component interface between layers. The other method is to add an easy removable material in the middle between layers for forming a component interface between layers.

By using bad adhesion ability in the middle between layers as a method of forming the component interface method, the bad adhesion material or manufacture can control the adhesion strength on the bonding interface. Therefore, the bonding interface between two adjacent layers has very weak adhesion strength, but the weak adjacent interface is sufficient to implement the manufacture.

There are many kinds of bad adhesion materials applied in the present invention, such as, Ceramal and Tungsten, Tungsten and Copper, and Tungsten and Nickel. Further, the present invention with the internal stress of the material also can make the bonding interface easily separated.

For example, after sputtering Copper on the surface of Tungsten, the surface of Copper is plated by Nickel. When the thickness of Nickel is thicker, the larger the internal stress will be. Therefore, once Nickel is plated with larger thickness, the interface of Tungsten and Copper can easily be separated.

Further, there are many kinds of bad adhesion manufactures. For example, the adhesion condition on Tungsten surface by Nickel sputtering is worse than the one by physical sputtering. As well, the surface of Tungsten or Copper forms an easy removable oxide layer. Besides, coating adhesive is done before coating Polyimide (PI). If the adhesive is not added, the adhesion ability becomes worse, and the baked solidified condition of PI will affect the adhesion ability.

Figure 1:
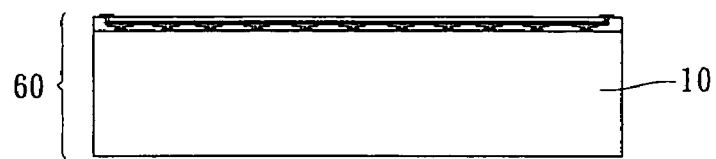
FIG. 1 is a prior art showing the semiconductor or MEMS component with the manufactured substrate, and the manufactured substrate over 80% of the component.
Figure 2:
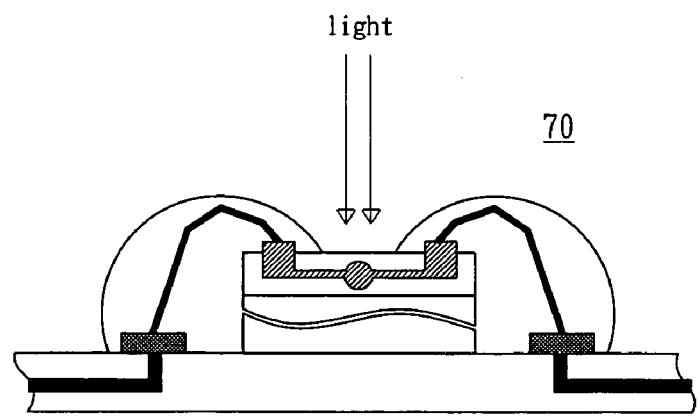
FIG. 2 shows a prior CMOS sensor component of the opto-electronic component requiring avoiding covering the sensor unit during packaging.
Figure 3:
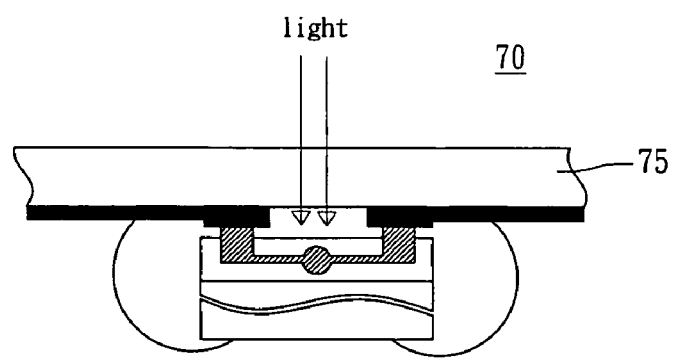
FIG. 3 shows another prior CMOS sensor component requiring the transparent package substrate.
Figure 4:
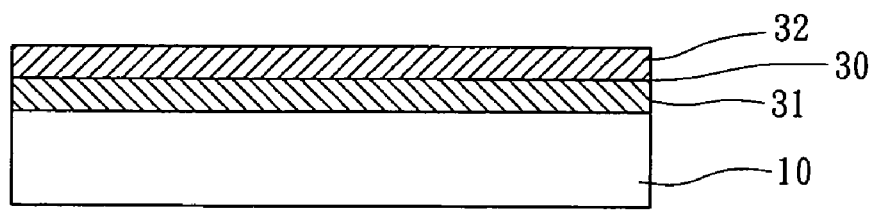
FIG. 4 is one of the preferred embodiments in the present invention showing a component interface used by a bad adhesion material.
Figure 4:
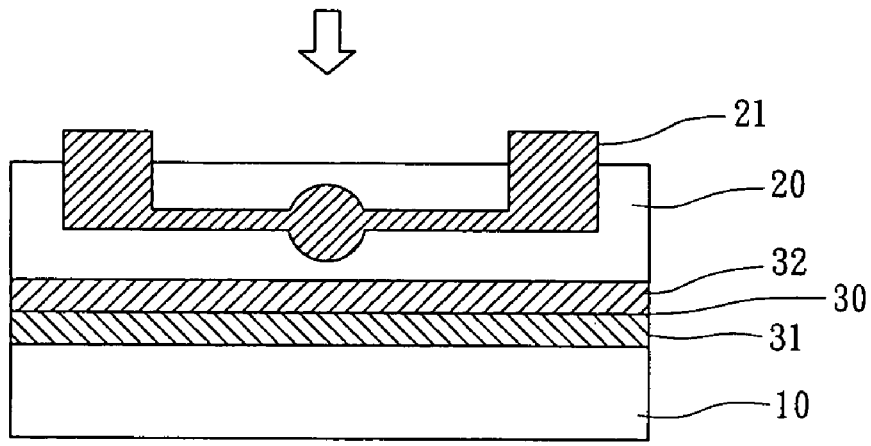
Figure 4:
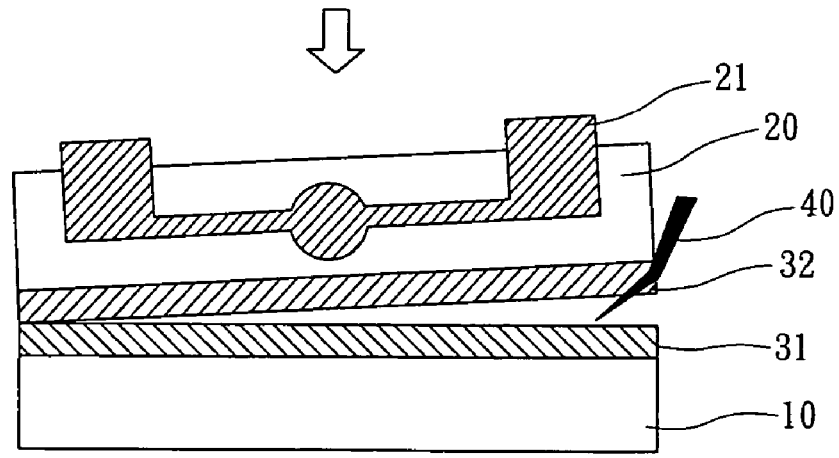
Figure 4:
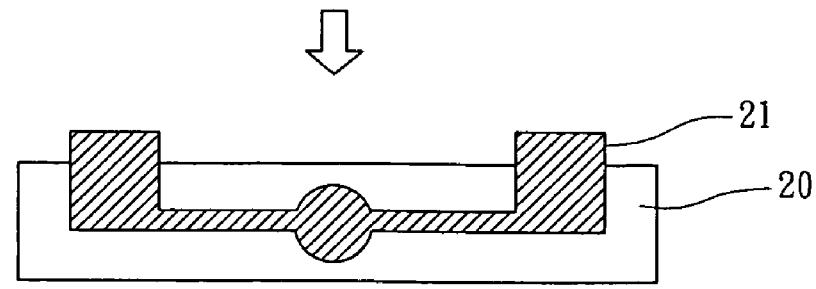

FIG. 4 is one of the preferred embodiments in the present invention showing the component interface used by bad adhesion material. First, step 4a is processed. A 0.5 μm thickness of Tungsten metal layer (31) is manufactured on the substrate (10). Then, a 0.5 μm thickness of Nickel metal layer (32) is manufactured by sputtering. Later, another 20~50 μm thickness of Ni metal layer (32) is increased by plating.

A component interface (30) is formed between Tungsten metal layer (31) and Nickel metal layer (32). Later, step 4b is processed. The thin film component (20) with the circuit or the MEMS structure (21) is manufactured on Nickel metal layer (32). After step 4b is done, step 4c, step 4d are processed, respectively. In the outer area of the substrate (10), the external stress can destruct the component interface (30) and remove the thin film component (20). For example, the middle between Tungsten metal layer (31) and Nickel metal layer (32) cut by cutting edge can destruct the component interface (30). Besides, when one end of the component interface (30) is under destruction, the thin film component (20) can easily be removed only by a little upper force.

Figure 5:
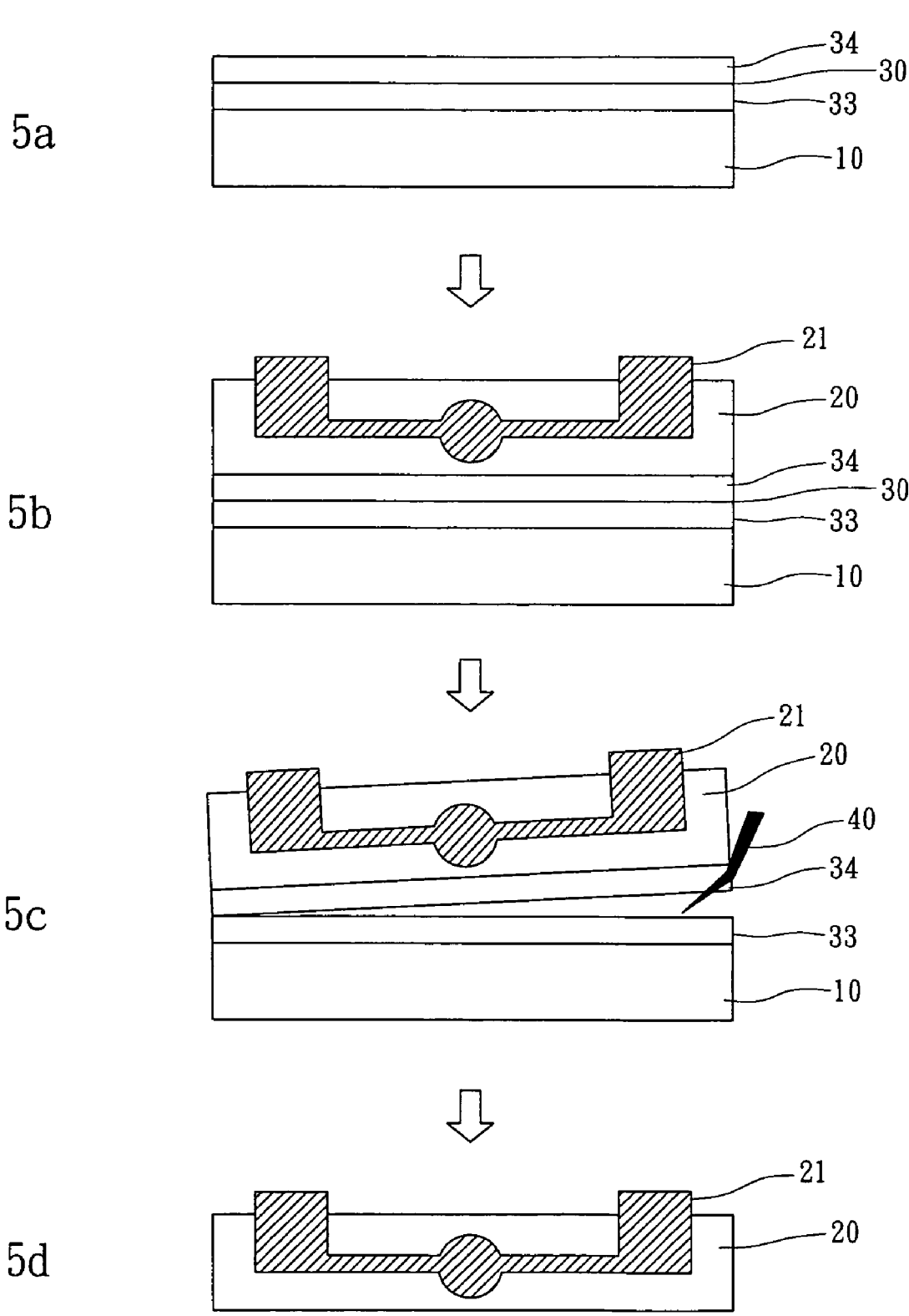
FIG. 5 is one of the preferred embodiments in the present invention showing the component interface used by bad adhesion manufacture.

FIG. 5 is one of preferred embodiments in the present invention showing a component interface used by bad adhesion manufacture. First, step (5a) is processed to have two layers of Polyimide (PI) (33) and (34) being continuously coated on the substrate (10). The first layer PI (33) is coated with adhesive, and controls the bake solidified time at an adequate bake solidified temperature. For example, at 120□, 180□, and 240□ of the bake solidified temperature, two layers of PI (33) and (34) individually bake for 3.5 minutes. However, the second layer PI (34) without any adhesive controls the bake solidified time at the same adequate bake solidified temperature. In another example, at 120□, 180□, and 240□ of the bake solidified temperature, they all bake for 3.5 minutes.

Therefore, the component interface (30) is formed between the first PI layer (33) and the second PI layer (34). Later, step (5b) is processed to have a thin film component (20) with the circuit or the MEMS structure (21) being manufactured on the second PI layer (34). After step (5b) is done, step (5c) and step (5d) are taken respectively, i.e., by external stress forced on outer area of the substrate (10) to destruct the component interface (30) and remove the thin film component (20) from the component interface (30).

Take the component interface (30) shown in FIG. 4 as an another example, in the middle between the Tungsten metal layer (31) and Nickel metal layer (32) cut by a cutting edge, the component interface (30) is easily destroyed. And, when one end of the component interface (30) is under destruction, the thin film component (20) can easily be removed only by a little upper force.

Furthermore, the first method of forming the component interface in the present invention can use bad material and manufacture to make the component interface. For example, a 0.5 μm thickness of Tungsten metal layer first is manufactured on the substrate and it is put in the liquid with 15% H2O2 for 5 minutes as forming an oxide layer. Then, a 0.5 μm thickness of Copper metal layer is manufactured by sputtering. Later, another 20~50 μm thickness of Nickel metal layer is manufactured by plating. Therefore, a component interface is formed between the Copper metal layer and Tungsten metal layer.

The other method of forming the component interface in the present invention is to add the etching or deteriorate material in the middle between layers. For example, an easy etching Copper or a deteriorate polymer is added in the middle between layers. Moreover, the etching method is used to remove some easy etching materials. In another example by other method, such as by heat or sunshine, the adhesion characteristic of the deteriorated material is disappeared or forms an unstable interface.

Figure 6:
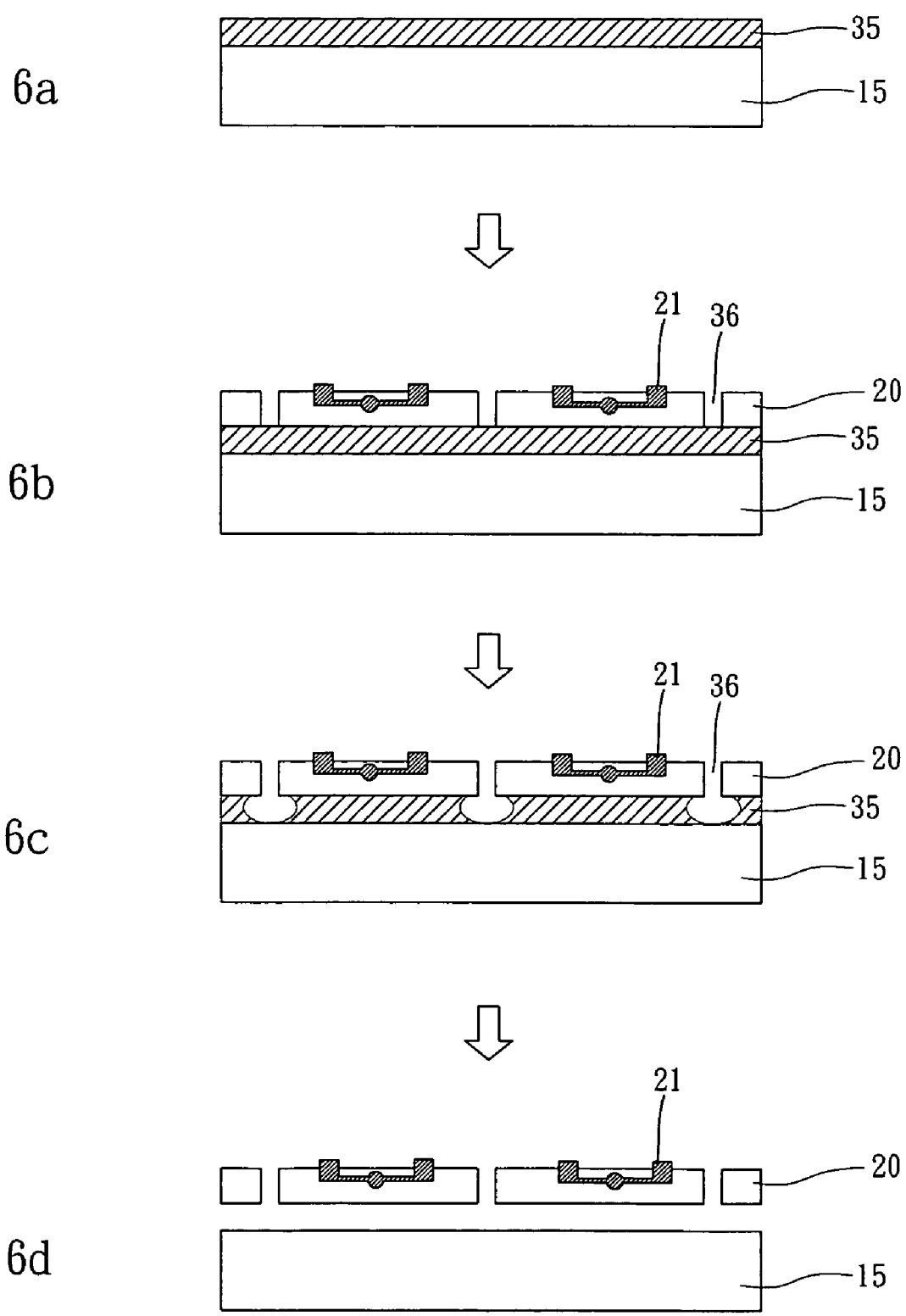
FIG. 6 is one of the preferred embodiments in the present invention showing the component interface used by a removable material.

FIG. 6 is one of the preferred embodiments in the present invention showing the component interface used by a removable material. First, step (6a) is processed to have a 0.7 μm thickness of the easy etching Copper metal layer (35) being manufactured on the ceramic substrate (15). Then, step (6b), step (6c) are processed respectively, and the thin film component (20) with the circuit or MEMS structure (21) and the etching hole (36) are manufactured on the Copper metal layer (35). Later, step (6c) is processed to have the whole substrate (15) is put into the etching liquid of Copper. The etching liquid of Copper etches the Copper metal layer (35) through the etching hole (36). After the Copper metal layer (35) is completely etched, the thin film component (20) naturally is separated from the substrate (15).

The present invention is to provide the method of forming a component interface in semiconductor or microelectromechanical system (MEMS) manufacture, which main application is to manufacture all kinds of circuit thin films or MEMS thin films with an electronic circuit, a micro structure, and different kinds of MEMS components. More particularly, it is applicable to make a MEMS thin film without the manufactured substrate but with flexibility, and specially on both sides of the MEMS thin film provided with an electronic joint, a micro structure, and all kinds of MEMS components can be manufactured.

In this kind of MEMS thin film manufacture, it makes use of the method of forming the component interface of the present invention mentioned above. Therefore, a component interface is pre-formed on a manufactured substrate. And, after the MEMS thin film on the manufactured substrate is done, the MEMS thin film product may be easily removed from the manufactured substrate.

Figure 7:
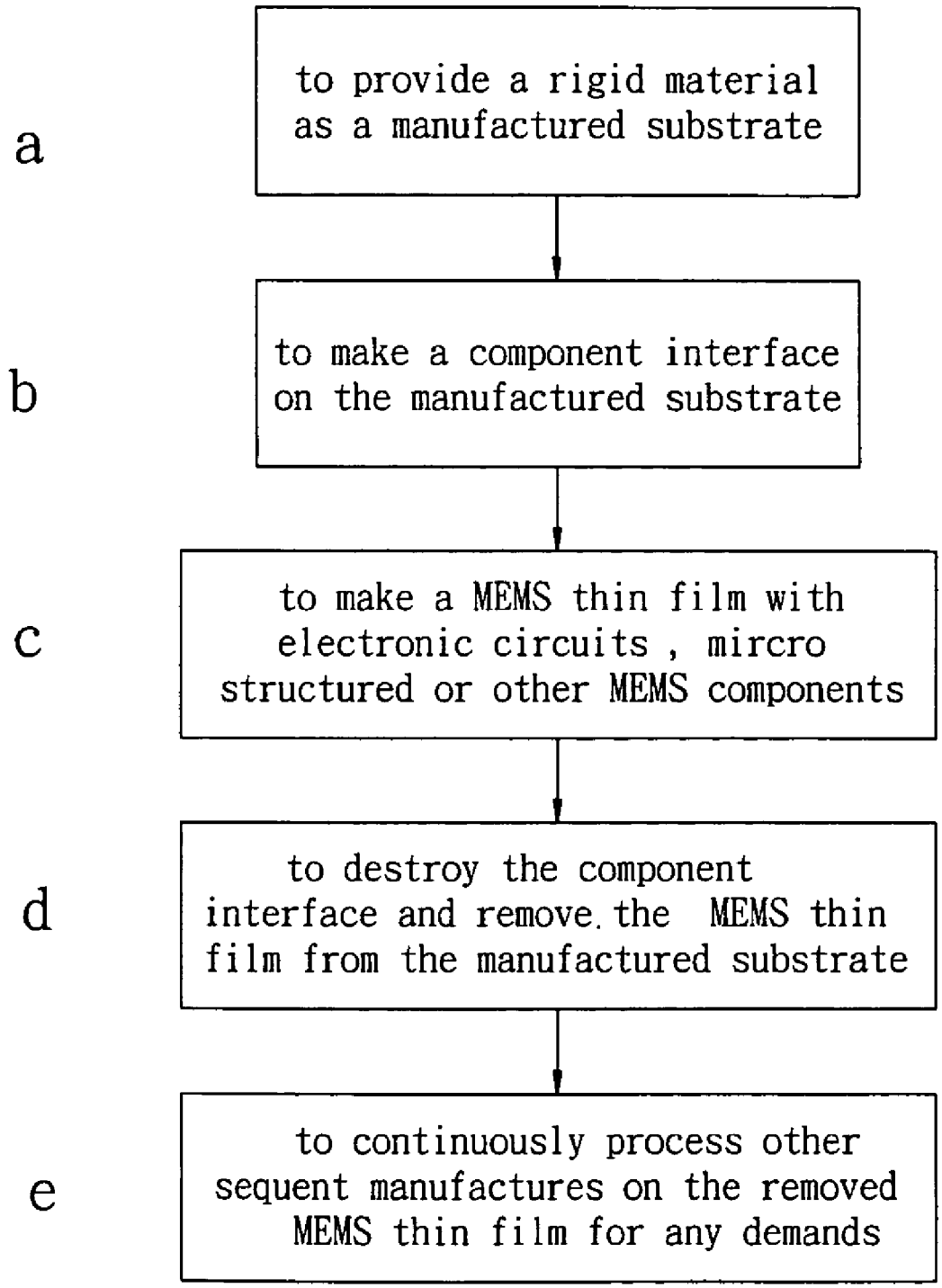
FIG. 7 shows a flow chart used by the method of forming the component interface of the present invention applying different kinds of MEMS thin films.

As shown in FIG. 7, a method of making flexible MEMS thin film without manufactured substrate is another disclosed invention which includes the following steps, and the step (b) herein is just used the method of forming the component interface of the present invention described above.

Step (a): providing a rigid material as the manufactured substrate;

Step (b): making a component interface on the manufactured substrate;

Step (c): by using the semiconductor or MEMS manufacture to make the MEMS thin film with all kinds of electronic circuits, micro structures, or other MEMS components;

Step (d): destroying the component interface between the manufactured substrate and the MEMS thin film for separating the manufactured substrate and the MEMS thin film; and Step (e): removing the MEMS thin film, or processing other sequent manufactures after removing the MEMS thin film for any demands.

Figure 8:
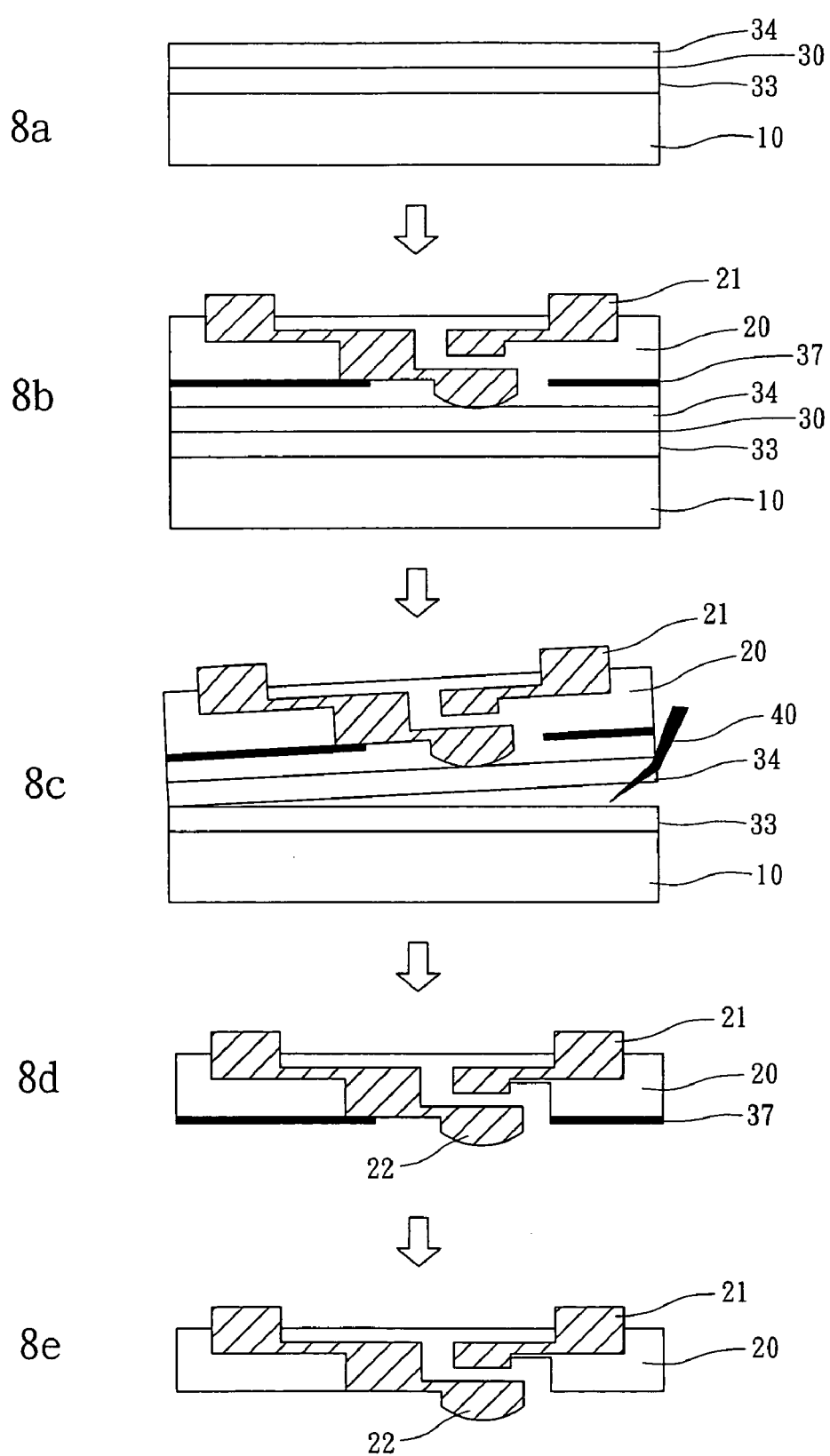
FIG. 8 is one of the preferred embodiments in the present invention showing the flexible MEMS thin film without the manufactured substrate used by the method of forming the component interface in the present invention.

FIG. 8 is one of preferred embodiments showing the flexible MEMS thin film without manufactured substrate used by the method of forming the component interface in the present invention. First, the manufactured substrate (10) made from a rigid material is prepared. Then, step (8a) is processed to have two layers of PI (33) and (34) are continuously coated on the manufactured substrate (10). Then, the bad adhesion in the middle between two PI layers (33) and (34) is formed as a component interface (30). Later, step (8b) is processed. By the MEMS manufacture, a thin film component (20) with the circuit or micro structure (21) is made on the second PI layer (34), and the inside of the thin film (20) is pre-set an etching photoresist layer (37). After step (8b) is done, step (8c) and step (8d) are processed respectively to have the middle between two PI layers (33) and (34) is cut by a cutting edge to destruct the component interface (30). Therefore, the manufactured substrate (10) and thin film component (20) are separated. Then, step (8d) is processed to have the PI (34) being removed from the thin film component (20) and the other surface of thin film component (20) being continuously processed. After step (8d) is done, step (8e) is processed to have the etching photoresist layer (37) being removed therefrom. Finally, a flexible MEMS thin film without manufactured substrate and with flexibility is obtained, particularly, on both sides of the flexible MEMS thin film with an electronic joint, a micro structure shall be manufactured.

Further, the method of making flexible MEMS thin film without manufactured substrate of the invention is not only limited to from step (a) to step (e) mentioned above, any making steps necessary for making the flexible MEMS thin film provided with a special structural design are further allowed to be processed in the manufactures of making the flexible MEMS thin film without manufactured substrate of the invention. As an example, after the step (a) of providing a rigid material as the manufactured substrate is completed, a making step of coating a conductive metal layer onto the manufactured substrate may be processed subsequently for constituting a conductive path from the conductive metal layer coated on the manufactured substrate and used in later making steps of making the flexible MEMS thin film without manufactured substrate.

Figure 10:
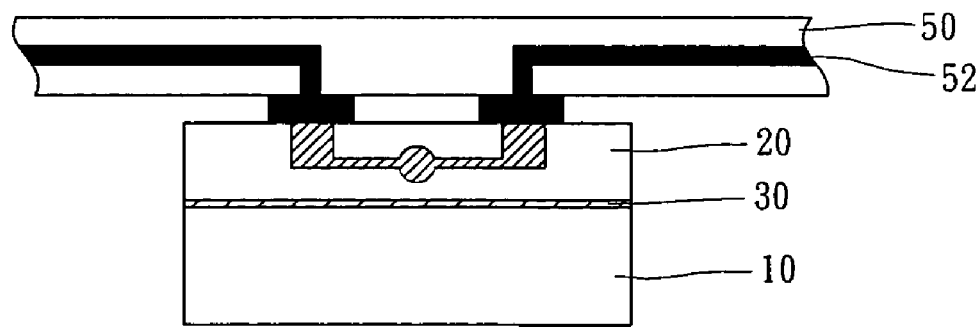
FIG. 10 is one of the preferred embodiments in the present invention showing that the substrate is removed after the assembly.
Figure 10:
Figure 10:
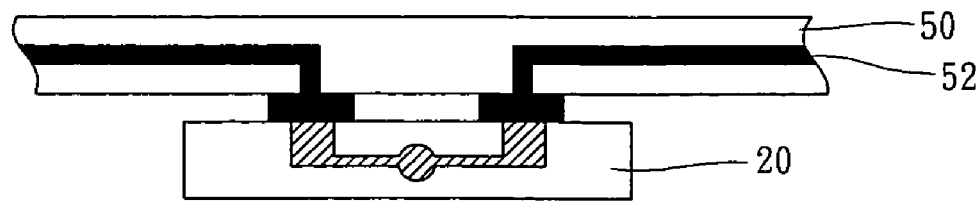

As another example, after the step (c) of making electronic circuits, micro structures, or other MEMS components on the MEMS thin film is completed, a making step of assembling, constituting or working those electronic circuits, micro structures, or other MEMS components formed on the MEMS thin film with other coupling components is further allowed to be processed subsequently, so that due to tiny structural design the difficult problem of not easily holding the electronic circuits, micro structures, or other MEMS components formed on the MEMS thin film is wholly avoided and overcome in later making steps of making the flexible MEMS thin film without manufactured substrate. As illustrated in FIG. 10, after the step (c) of making electronic circuits the MEMS thin film (20) is completed, a making step of assembling the electronic circuits of MEMS thin film (20) with circuit joint (52) of a coupling circuit board (50) as an electric connection is processed subsequently, and then the step (d) is processed to destroy the component interface (30) between the manufactured substrate (10) and the MEMS thin film (20) for separating the MEMS thin film (20) from the manufactured substrate (10). It is obviously no problem to achieve an electric connection between the MEMS thin film (20) and the coupling circuit board (50).

The method of making flexible MEMS thin film without manufactured substrate by the present invention has the following advantages or different features compared to the method of forming MEMS thin film by the conventional semiconductor manufacture:

1. The manufactured substrate has a component interface while applying the method of forming the component interface of the present invention.
2. The manufactured MEMS thin film and substrate are separate. Further, the feature of the MEMS thin film only relates to the manufactured structure and material of MEMS itself, and will not be affected by the manufactured substrate.
3. The manufactured substrate with rigid material can repeatedly be used.
4. After separating the MEMS thin film and the substrate, the other side of the MEMS thin film can be processed by etching or plating. Therefore, both sides of the MEMS thin film can be processed.
5. The circuit and different kinds of structural design are easily integrated and manufactured into the inside or both sides of the MEMS thin film of the invention.

Therefore, according to the above description, the MEMS thin film of the invention manufactured by the method of forming the component interface has the following advantages:

1. The manufacture ability to tiny size and tiny wire pitch of MEMS components or circuits formed on MEMS thin film is so superior that cannot be achieved by the traditional printed circuit board or the flexible printed circuit board technique.

Since the MEMS thin film mostly is made by the semiconductor lithography manufacture, the manufacture ability to tiny size and tiny wire pitch can easily achieve up to 20 µm or less, but the traditional technique of the printed circuit board or the flexible circuit board can not achieve less than 30 µm.

2. The Multiple-layers of the circuit and thin thickness can be achieved. The MEMS thin film used by the present invention can easily stack over 10 layers, and the thickness can be controlled up to 200 µm or less. For example, the dielectric layer has 1 µm of thickness, and the wire has 5 µm of thickness in the MEMS thin film. The total thickness for 10 layers is less than 200 µm. However, the traditional technique of the printed circuit board, the flexible circuit board, and the flip-chip substrate cannot achieve the purpose.

3. The circuit joint and the micro structure can be manufactured on different sides of MEMS thin film of the invention. And, the circuit joint in one side of the MEMS thin film forms a circuit connection. It will not affect the other side of the micro structure in the MEMS thin film. By using the method of forming component interface of the present invention to manufacture the invented MEMS thin film of the invention, one side of the MEMS thin film is manufactured for all kinds of electronic circuits, micro structures or other MEMS components, and then is separated from the substrate. Later, the other side of the MEMS thin film is processing the sequent manufacture.

Therefore, both sides of the MEMS thin film can be made for the circuit joint and the micro structure. There are some advantages on both sides of the MEMS thin film with the circuit joint and the micro structure as follows:

(1) Both sides of the MEMS thin film all can connect with other components or electronic circuits.

(2) If one side of the MEMS thin film has an electronic joint and the other side has a micro structure, the circuit joint of the MEMS thin film or the electronic circuit forms the electronic connection. The function of the micro structure on the other side will not be affected. However, the traditional MEMS thin film manufactures the circuit joint and the micro structure on the same side which structure will affect the function of MEMS thin film.

Figure 9:
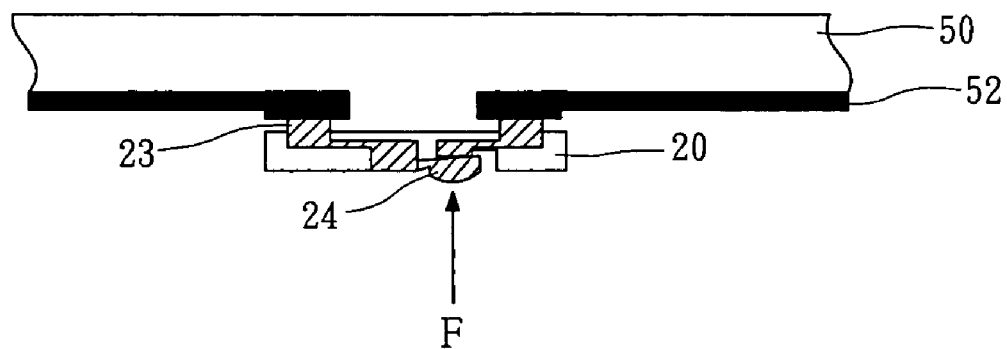
FIG. 9 is one of the preferred embodiments in the present invention showing that the circuit joint and the micro structure can be individually manufactured on different sides of the MEMS thin film. As well, one side of the MEMS thin film forms a circuit connection without affecting the function on the other side of the micro structure.

As illustrated in FIG. 9, the thin film component (20) is formed by the method of forming component interface of the present invention in MEMS manufacture. After the sequent manufactures, both sides of the thin film component (20) are individually manufactured with the electronic circuit (23) and the micro structure (24). The thin film component (20) in practice can be made as a contact sensor.

Besides, the electronic joints (23) in one side of the thin film component (20) and the electronic joint (52) of another circuit board (50) form as an electronic connection. Moreover, it does not affect the function in the other side of MEMS structure (24). When thin film component (20) is under external force (F), the electronic connection is formed.

4. The material of MEMS thin film can use a flexible material. After the MEMS thin film is separated from the substrate, the MEMS thin film product has flexibility. This type of flexible MEMS thin film without manufactured substrate of the invention can be assembled with all kinds of structures. However, the traditional MEMS thin film even without the substrate does not have flexibility. Therefore, the range of usage is limited.

The MEMS thin film without manufactured substrate of the present invention has flexibility, and is an important advantage for the present invention. The flexibility characteristic of MEMS thin film varies by different manufacture materials. For example, the dielectric material of MEMS thin film is selected from PI, and the metal material is selected from Copper or aluminum. The MEMS thin film itself contains flexibility. The MEMS film can be used on the rugged surface by using the flexibility of the MEMS thin film during assembly. More particularly, the flexible MEMS thin film can present different characteristics by different hardness of the assembly structure. For example, if it is attached to elastic material, the flexible MEMS thin film also is elastic.

5. The micro structure and the circuit of the MEMS thin film are easy to integrate for manufacture. It can decrease the difficulty of assembly and circuit connection.

By using the method of forming the component interface in the present invention for manufacturing the MEMS thin film, micro structure, and/or electronic circuit, and MEMS thin film can be formed as a body. The structure can decrease the assembly manufacture of the micro structure and the micro circuit. Further, as shown in FIG. 10, the thin film component (20) used by the present invention can also keep the substrate (10) without separation. After the thin film (20) is assembled to the circuit joint (52) of another circuit board (50) for forming the electronic connection, the substrate (10) then is removed.

According to the mentioned advantages from the above description, the circuit thin film or the MEMS thin film used by the method of forming component interface of the present invention all can be separated or removed from the substrate after finishing the manufacture of the electronic circuit and the micro structure. It does not destroy the substrate and the circuit thin film, or the electronic circuit and the micro structure of the MEMS thin film, but the substrate can also be used repeatedly as well reduce costs. The manufacture change of the circuit thin film or MEMS thin film is increased.

Furthermore, the circuit thin film or the MEMS thin film used by the method of forming component interface of the present invention is made use of the semiconductor technique in the graph to have the wire pitch to be more micro-minimized or changeable. Moreover, the circuit, the mechanical structure, and the thin film are integrated and formed as a one piece. Therefore, thin film circuit is widely applied in the circuit board, the flip-chip package substrate, the thin film of panel circuit connection, test card, the MEMS related product, and other circuit connection devices. The present invention can be used widely, repeatedly manufactured, and is low cost.

Although a few preferred embodiments of the present invention have been shown and described in the above, the scope of the invention is not limited to the above disclosed embodiments and extended to any technique used by the MEMS thin film disclosed in the present invention to integrate the electronic circuit, the micro structure or the mechanical electricity for manufacturing different kinds of circuit thin film or MEMS thin film products without manufactured substrate no matter by the replacement and improvement.

What is claimed is:

1. A process for producing flexible MEMS thin film without manufactured substrate, comprising the steps of:
    (a) providing a rigid material as a manufactured substrate;
    (b) making a component interface on the manufactured substrate of step (a);
        wherein the component interface easily destroyed by an external force is made from bad adhesive materials having bad adhesion ability or made by bad adhesive manufacture having weak adhesion strength to the manufactured substrate, or the component interface easily removed by etching is made from an easy etching and removable material;
    (c) after step (b) is done, using MEMS manufacture to make a MEMS thin film having electronic circuits, micro structures or other MEMS components on the component interface of step (b);
    (d) destroying the component interface between the manufactured substrate and the MEMS thin film for separating the MEMS thin film from the manufactured substrate; and
    (e) removing the MEMS thin film or processing other sequent manufactures after removing the MEMS thin film for any demands.

2. The process for producing flexible MEMS thin film without manufactured substrate as cited in claim 1, wherein a making step of coating a conductive metal layer onto the manufactured substrate for constituting a conductive path used in later making steps is processing after step (a) is done, and then processing the step (b).

3. The process for producing flexible MEMS thin film without manufactured substrate as cited in claim 1, wherein a making step of assembling, constituting or working those electronic circuits, micro structures or other MEMS components formed on the MEMS thin film of step (c) with other coupling components is further processing after the step (c) is done, and then processing the step (d).

4. The process for producing flexible MEMS thin film without manufactured substrate as cited in claim 3, wherein the separated MEMS thin film in step (e) is further processing a sequent manufactures to make the MEMS thin film having electrical circuits, micro structure or MEMS components integrated and manufactured into inside or on both sides.

5. The process for producing flexible MEMS thin film without manufactured substrate as cited in claim 1, wherein the seperated MEMS thin film step (e) is further processing a sequent manufactures to make the MEMS thin film having electrical circuits , micro structure or MEMS components intergrated and manufactured into inside or on both sides.

* * * * *